United States Patent [19]
Nicollian et al.

[11] Patent Number: 5,521,525
[45] Date of Patent: May 28, 1996

[54] METHOD AND APPARATUS FOR MEASURING THE DOPING DENSITY PROFILE OF A SEMICONDUCTOR LAYER

[75] Inventors: Edward H. Nicollian; Catherine E. Blat, both of Charlotte, N.C.

[73] Assignee: University of North Carolina, Charlotte, N.C.

[21] Appl. No.: 228,077

[22] Filed: Apr. 15, 1994

[51] Int. Cl.$^6$ ........................................... G01R 31/26
[52] U.S. Cl. ..................... 324/765; 324/766; 324/767; 324/158.1
[58] Field of Search ................... 324/765, 766, 324/767, 158.1

[56] References Cited

PUBLICATIONS

L. M. Terman, *An Investigation of Surface States at a Silicon/Silicon Oxide Interface Employing Metal–Oxide–Silicon Diodes*, Solid State Electronics, Pergamon Press 1962, vol. 5, pp. 285–299. (1962—month unavailable).

W. Van Gelder and E. H. Nicollian, *Silicon Impurity Distribution as Revealed by Pulsed MOS C–V Measurements*, Solid State Science, J. Electrochem. Soc., Jan. 1971, pp. 138–141.

C. N. Berglund, *Surface States at Steam–Grown Silicon—Silicon Dioxide Interfaces*, IEEE Transactions On Electron Devices, vol. Ed–13, No. 10, Oct. 1966.

E. H. Nicollian and A. Goetzberger, *MOS Conductance Technique for Measuring Surface State Parameters*, Applied Physics Letters, vol. 7, No. 8, 15 Oct. 1965.

R. Castagne and A. Vapaille, *Description of the SiO2–Si Interface Properties by Means of Very Low Frequency MOS Capacitance*, Surface Science, 28 (1971), pp. 157–193 (1971—month unavailable).

K. Lehovek, A. Slobodskoy and J. L. Sprague, *Field Effect–Capacitance Analysis of Surface States of Silicon*, phys. stat., vol. 3, 447 (1963), pp. 447–464. (1963—month unavailable).

J. R. Brews and E. H. Nicollian, *Improved MOS Capacitor Measurements Using the Q–C Method*, Solid State Electronics, vo. 27, No. 11, pp. 963–975. 1984. (1984—month unavailable).

Brochure, Section 4, Analysis, pp. 4-1-4-41. (Author, Date unavailable).

E. H. Nicollian and A. Goetzberger, *The Si—SiO2 Interface–Electrical Properties as Determined by the Metal–Insulator–Silicon Conductance Technique*, The Bell System Technical Journal, vol. XLVI, No. 6, Jul.–Aug. 1967.

*Primary Examiner*—Kenneth A. Wieder
*Assistant Examiner*—Kourosh Cyrus Khosravi
*Attorney, Agent, or Firm*—Bell, Seltzer, Park & Gibson

[57] ABSTRACT

The doping density profile and thus the process-related parameters which control the operation and performance of a semiconductor layer, such as that in metal-insulator-semiconductor (MIS) device are reliably determined by determining the difference in the measured and calculated band bendings of a semiconductor layer in accumulation mode. In addition, high and low frequency C-V measurements of the MIS device are performed in order to calculate a second band bending and to approximate the doping density profile of the semiconductor layer. Based upon the approximated doping density profile, an approximate band bending curve is generated. The difference between the approximate and second band bending curves is then compared to the difference between the measured and calculated band bendings of the semiconductor layer in accumulation to determine the variance therebetween. The doping density profile is repeatedly revised until the variance is less than a predetermined amount so that the approximate doping density profile, and the process-related parameters calculated therefrom, are unique and reliable.

35 Claims, 4 Drawing Sheets

1

METHOD AND APPARATUS FOR MEASURING THE DOPING DENSITY PROFILE OF A SEMICONDUCTOR LAYER

FIELD OF THE INVENTION

The present invention relates to electrical measuring systems and methods and, more particularly, semiconductor device measuring systems and methods.

BACKGROUND OF THE INVENTION

Metal-insulator-semiconductor (MIS) devices such as MIS capacitors and MIS field effect transistors (MISFET), are utilized in a wide variety of applications, including test structures, and digital and analog applications in integrated circuit technology. An MIS device typically consists of a semiconductor substrate, such as a silicon (Si) substrate which has been doped with either an n-type dopant, such as phosphorus, or a p-type dopant, such as boron. An MIS device also includes an insulating layer, typically formed by an oxide such as silicon dioxide ($SiO_2$), which is grown or deposited on one surface of the semiconductor substrate. Finally, a layer of conductive material, such as degenerately doped polysilicon or a metal, is deposited on the surface of the insulating layer, opposite the semiconductor layer. Because the insulator is typically oxide, these devices are also referred to as metal-oxide-semiconductors (MOS) devices.

Electrical contacts may thereafter be formed to the metal or degenerate polysilicon layer and to the surface of the semiconductor layer opposite the insulating layer to produce a MIS capacitor. The electrode to the metal or degenerate polysilicon layer is generally referred to as the gate electrode and the electrode to the semiconductor layer is generally referred to as the semiconductor substrate electrode. Source and drain contacts may also be formed to laterally spaced apart regions of the semiconductor layer on opposite sides of the metal and insulating layers to produce a MISFET.

Due, in part, to the importance and widespread use of MIS devices, several methods have been proposed for approximating several parameters of the MIS devices which, in turn, predict the characteristics and operating performance of MIS devices. The parameters which determine the performance of an MIS device are related to or are dependent upon the process by which the MIS device is fabricated and include the threshold voltage of the MIS device which depends upon the doping density profile of the semiconductor layer, the thickness of the insulating layer, the fixed charge density of the insulating layer, the interface trap density and the voltage across a depleted semiconductor layer upon the application of a bias voltage between the gate electrode and the semiconductor layer. Accordingly, the parameters of a MIS device may be analyzed to determine if the device will perform satisfactorily.

One or more of these parameters is typically estimated based upon an analysis of the capacitance-voltage (C-V) characteristics of a MIS device. The C-V characteristics of a MIS device are determined by applying varying voltages, typically referred to as bias voltages, between the gate and semiconductor substrate electrodes and measuring the resulting capacitance of the insulating and semiconductor layers. The bias voltage generally includes a DC voltage upon which an AC voltage is superimposed. The DC voltage is incrementally varied such that the MIS device operates successively in an accumulation mode and a depletion mode.

In accumulation mode, the majority carrier concentration, i.e., the electron carrier concentration for an n-doped semiconductor layer, is greater near the interface of the insulating and semiconductor layers than in the bulk region of the semiconductor layer removed from the interface. In contrast, in depletion mode, the electron and hole concentrations at the interface of the insulating and semiconductor layer is less than determined by the doping concentration in the bulk region of the semiconductor layer.

The energy levels and relaxation times of interface traps at an Si—$SiO_2$ interface were calculated based upon the C-V characteristics of a metal-oxide-semiconductor (MOS) device measured over a wide range of frequencies as reported by L. M. Terman, Solid-State Electronics, Vol. 5, p. 285 (1962) and K. Lekovec, et al., Phys. Stat. Solids, Vol. 3, p. 447 (1963). The interface trap density of an MOS capacitor has also been determined, as a function of Si bandgap energy, from C-V measurements obtained with a slowly varying DC bias voltage ramp. See C. N. Berglund, IEEE Transactions Electronic Devices, Vol. ED-13, 701 (1966).

The interface trap density of a MOS capacitor as a function of the Si bandgap energy was also obtained from C-V measurements employing AC signals having both a relatively high frequency and a relatively low frequency which are superimposed upon a DC bias voltage. See R. Costagné, et al., Surface Science, Vol. 28, p. 557 (1971). For example, a varying DC signal having a relatively high frequency AC signal superimposed thereon could be applied between the gate and semiconductor substrate electrodes. Thereafter, a varying DC signal having a relatively low frequency AC signal superimposed thereon could be applied between the gate and semiconductor substrate electrodes such that C-V measurements could be obtained for bias voltages having both high and low frequency AC signal components superimposed thereon.

An alternative method, referred to as a conductance method, for determining the electrical properties of interface traps at the Si—$SiO_2$ interface was proposed by the present inventor E. H. Nicollian and A. Goetzberger, Bell System Tech. J., Vol. 46, p. 1055 (1967). According to the conductance method, a bias voltage having both DC and AC components is applied. Thereafter, the admittance measured between the gate electrode and the semiconductor substrate electrode is measured as a function of both the amplitude of the bias voltage and the frequency of the AC signal superimposed thereon. Based upon the measured admittance, the interface trap density may be calculated.

As disclosed by W. Van Gelder and E. H. Nicollian in the Journal of the Electrochemical Society, Vol. 118, p. 138 (1971), a doping density profile of the semiconductor layer near an Si—$SiO_2$ interface may be approximated based upon the C-V characteristics of a MOS capacitor. Subsequently, a charge-capacitance (Q-C) method was proposed by J. R. Brews and E. H. Nicollian in Solid-State Electronics, Vol. 27, p. 963 (1984). The Q-C method includes a C-V measurement performed with a relatively high frequency AC signal superimposed upon a varying DC bias voltage. A charge-voltage (Q-V) measurement is then obtained by applying a varying DC bias voltage and measuring the resulting change in charge across the oxide and semiconductor layers of the MOS capacitor. From the C-V and Q-V measurements, the process-dependent parameters of the MIS device could be approximated.

The Q-C method proposed by J. R. Brews and E. H. Nicollian, however, does not uniquely yield the parameters that quantitatively determine the doping profile, nor does it measure the doping profile of the semiconductor layer near the interface of the insulating and semiconductor layers since the charge neutrality principle upon which the Q-C method is based does not apply near the interface. For example, in a p-doped semiconductor layer, the hole density near the interface of the insulating and semiconductor layers is not equal to the acceptor density at a given depth from the interface.

Since the doping density profile near the interface of the insulating and semiconductor layers is not measured by the Q-C method, the doping density profile near the interface is extrapolated. This extrapolation is based upon fitting the doping density profile of the semiconductor layer in regions spaced apart from the insulating-semiconductor interface in which the charge neutrality principle is applicable with a profile function known from the processing, such as a Gaussian or error function compliment profile. Therefore, while the doping density profile of the semiconductor layer near the insulating-semiconductor interface may be extrapolated in this manner, a unique set of parameters that define the fitted profile function is difficult to obtain since numerous estimates of the doping density profile of the semiconductor layer are possible.

It is desirable to reliably determine the true doping density profile and the process-related parameters of a semiconductor layer, such as found in an MIS device, such that the operating characteristics or performance of the semiconductor layer or MIS device may be reliably predicted. Various methods and systems have been proposed for approximating one or more of the process-related parameters based upon C-V and/or Q-V measurements of an MIS device. These methods and systems, however, are limited in reliability or are not quantitative.

SUMMARY OF THE INVENTION

It is therefore an object of the invention to provide an improved method and apparatus for measuring the doping density profile of a semiconductor layer.

It is another object of the invention to provide an improved method and apparatus for measuring the doping density of an MIS device.

It is a further object of the invention to provide an improved method and apparatus for determining the process-related parameters of a semiconductor layer.

These and other objects are provided, according to the invention, by a method and apparatus for reliably measuring the doping density profile of a doped semiconductor layer by applying a first voltage between a conductor layer and the semiconductor layer, which drives the semiconductor surface into accumulation, and measuring the resulting capacitance of an insulating layer and the semiconductor layer. The first voltage is varied until the measured capacitance approaches a constant value. Preferably, the first voltage is varied until the rate of change of the measured capacitance of the insulating and semiconductor layers is less than a predetermined value.

Based upon the constant value approached by the capacitance of the insulating and semiconductor layers, a first band bending of the conduction and valence bands of the semiconductor layer in the accumulation mode is determined. The band bending of the semiconductor layer in the accumulation mode is also calculated based upon predetermined parameters established by the properties of the material forming semiconductor layer and the process for doping the semiconductor layer. The difference in the band bending additive constant between the band bending of the semiconductor layer in the accumulation mode as determined from the measured capacitance and as calculated is thereafter determined.

A second varying voltage is then applied between the conductor and semiconductor layers to drive the semiconductor layer into depletion and, more preferably, into deep depletion. The resulting capacitance of the insulating and semiconductor layers in series is measured as the second varying voltage is applied. The second varying voltage preferably includes a DC voltage which is varied through a predetermined range of DC voltages at a relatively slow rate so as to correspond to a low frequency signal. In addition, an AC signal having a relatively high frequency is preferably superimposed on the DC voltage as it is varied throughout the predetermined range. Accordingly, the resulting high frequency and low frequency capacitance of the MIS device may be simultaneously measured for the second varying voltage.

More particularly, the applied DC voltage is preferably varied between a first DC voltage wherein the semiconductor layer operates in accumulation mode and a second DC voltage wherein the semiconductor layer operates in a deep depletion mode. The depleted semiconductor layer is then preferably illuminated momentarily once the applied DC voltage has been varied from the first DC voltage wherein the semiconductor layer is in accumulation to the second DC voltage wherein the semiconductor layer is in deep depletion. By momentarily illuminating the deep depleted semiconductor layer, the semiconductor layer is inverted. Thereafter, the varying DC voltage is preferably returned from the second DC voltage wherein the momentarily illuminated semiconductor layer is inverted to the first DC voltage wherein the semiconductor layer is in accumulation such that capacitance measurements may be obtained with the MIS device in equilibrium.

Based upon the measured capacitances and the corresponding second voltages, the doping density profile of the semiconductor layer may be approximated. The doping density profile of the semiconductor layer is determined based upon the measured capacitances and the corresponding second voltages. Thereafter, by extrapolating, the doping density profile of a region of the semiconductor layer near the interface of the semiconductor and insulating layers is determined. In particular, the determination of the doping density profile of the semiconductor and insulating layers is preferably performed by determining the least squares fit of the doping densities determined at various depths within the semiconductor layer from the interface. Based upon the least squares fit and the predetermined type of doping of the semiconductor layer, the doping density profile is extrapolated to the interface between the insulating and semiconductor layers.

Based upon the approximate doping density profile of the semiconductor layer, the approximate band bending of the semiconductor layer is calculated in deep depletion. In addition, a second measured band bending in deep depletion may be determined directly from the measured capacitances and the corresponding second voltages. Thereafter, the difference between the approximate band bending and the second measured band bending of the semiconductor layer is determined. This difference or doping profile dependent additive constant is then compared with the true additive constant, defined as the difference between the measured and calculated band bendings of the semiconductor layer in accumulation mode, to determine the variance therebetween. Based upon this variance, the approximated doping density profile is adjusted or repeatedly revised until the variance between the band bending differences or between the doping profile additive constant and the true additive constant is less than a predetermined, preferably small, amount.

The bias voltages are preferably applied and the resulting capacitances measured by C-V measurement instrumentation. Such C-V measurement instrumentation preferably operates under the control of a program stored in the memory of a controller, such as a general purpose computer.

Therefore, the true doping density profile and the band bending of the conduction and valence bands of a semiconductor layer may be reliably determined. In particular, the true doping density profile and the true band bending of a semiconductor layer may be determined by the system and method of the present invention when the relative difference between the doping profile dependent additive constant and the true additive constant is less than a predetermined value, such as 0.1%. Once the true doping density profile and the true band bending of a semiconductor layer have been reliably determined, the remaining process-related parameters, including the threshold voltage of a MIS device, may be readily determined. Thus, the operating characteristics or performance of a MIS device may be reliably predicted according to the method and apparatus of the present invention.

DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiments set forth herein; rather, this embodiment is provided so that this disclosure will be thorough and complete and will fully convey the scope of the invention to those skilled in the art. Like numbers refer to like elements throughout.

Figure 1:
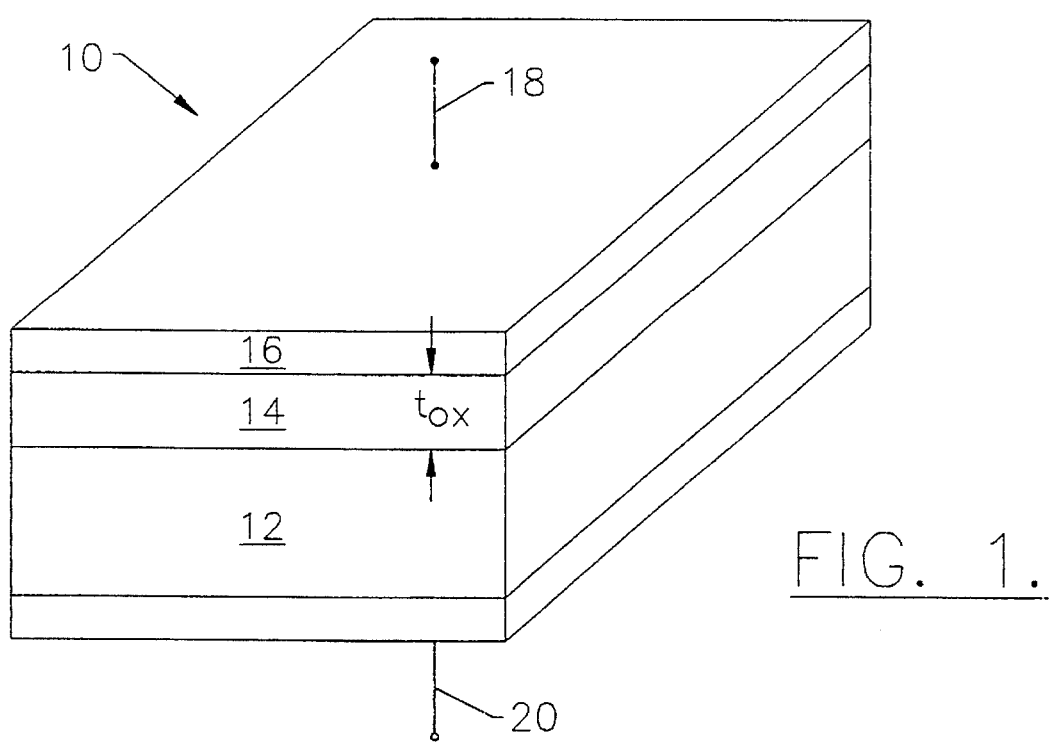
FIG. 1 is a perspective view of a greatly enlarged MIS device.

Referring now to FIG. 1, a MIS device and, more particularly, an MOS capacitor 10 is illustrated. The MOS capacitor 10 includes a doped semiconductor layer 12 and an insulating layer 14 thereon. A conductor layer 16 is on the insulating layer 14 opposite the semiconductor layer 12. As further illustrated, electrical contact may be established with the conductor layer 16 via a gate electrode 18 and with the semiconductor layer 12 opposite the insulating layer 14 via a semiconductor substrate electrode The conductor, insulating and semiconductor layers of the MIS device may be comprised of any suitable materials known to those skilled in the art. For example, the semiconductor layer 12 may be comprised of silicon (Si) doped with either an n-type dopant, such as phosphorus, or a p-type dopant, such as boron. Regardless of the particular dopant, the process by which the dopant is implanted or redistributed will control the general shape of the doping density profile relative to the depth within the semiconductor layer 12 from the interface of the semiconductor and insulating layers. For example, the redistribution of a dopant by thermal oxidation generally produces an error function compliment doping density profile. In contrast, ion implantation of a dopant generally produces a Gaussian doping density profile. Still further, deposition of the insulating layer 14 produces a relatively constant doping density profile with respect to depth within the semiconductor layer 12.

The conductor layer 16 of an MIS device is typically formed of polysilicon or a metal, such as aluminum. In addition, the insulating layer 14 is generally formed of an oxide, such as silicon dioxide ($SiO_2$). While an MOS capacitor 10 is illustrated, the present invention will apply equally to other MIS devices, such as MOS and complimentary-MOS (C-MOS) devices, including MOSFET's.

The parameters which determine the threshold voltage of a MIS device as well as its operating performance and characteristics depend upon the process by which the MIS device was fabricated. These parameters include the thickness, $t_{ox}$, of the insulating or oxide layer 14, the doping density profile, N(w), of the semiconductor layer 12, the fixed charge density in the insulating or oxide layer 14, the interface trap density, and the voltage across the semiconductor layer 12 when operating in depletion mode with a bias voltage applied between the gate and semiconductor substrate electrodes.

While the oxide thickness may be calculated based upon the dimensions of the MIS device and the materials forming the MIS device as known to those skilled in the art, the remainder of the process-dependent parameters, including the threshold voltage, must be determined based upon the doping density profile of the semiconductor layer 12. In order to reliably determine the doping density profile of the semiconductor layer 12 of a MIS device according to the present invention, the band bending of the conduction and valence bands of the semiconductor layer 12 is measured by the measurement system illustrated in FIG. 2 while the semiconductor layer 12 is in accumulation mode. Preferably, the first band bending of the semiconductor layer 12 is measured while in strong accumulation. As shown in FIG. 3, this first measured band bending, $\Psi_{SAM}$, is used to determine the true additive constant, $\Psi_{SOA}$, which is then compared with a doping profile dependent additive constant, $\Psi_{SO}$.

In order to measure the band bending of the conduction and valence bands of the semiconductor layer 12 in the accumulation mode, a first varying bias voltage, typically an incrementally varying DC voltage with an AC signal having a relatively high frequency superimposed thereupon, is applied between the conductor and semiconductor layers as shown in block 40 of FIG. 3. For example for an n-doped semiconductor layer 12, a DC voltage is applied which ranges from 5 V to 15 V and is varied at 1.4 V/sec. An AC voltage having a frequency of 1 MHz and a maximum amplitude of 15 mV is superimposed upon the DC signal.

For the MOS capacitor 10 illustrated in FIG. 1, the first bias voltage is applied between the gate and semiconductor substrate electrodes 18 and 20. The capacitance of the insulating and semiconductor layers resulting from the application of the first bias voltage is then measured across the gate and semiconductor substrate electrodes 18 and 20. As shown in block 42 of FIG. 3, the first bias voltage is preferably varied until the measured capacitance approaches a constant value. More particularly, the first bias voltage is preferably varied and the resulting capacitance is measured until the rate of change of the measured capacitance is less than a predetermined value, such as one-tenth of a percent (0.1%).

For a p-doped Semiconductor layer 12, an increasingly negative first bias voltage is applied until the measured capacitance approaches a constant value such that the p-doped semiconductor layer 12 is in accumulation. Alternatively, for a n-doped semiconductor layer 12, an increasingly positive first bias voltage is applied until the measured capacitance approaches a constant value such that the n-doped semiconductor layer 12 is in accumulation.

The band bending of the semiconductor layer 12 in accumulation may be measured as the capacitance approaches a constant value. In particular, for an n-doped semiconductor layer 12, as the measured capacitance approaches a constant value and the semiconductor layer 12 enters accumulation, the conduction band, $E_C$, and the Fermi energy level, $E_{FS}$, of the semiconductor layer 12 are equal in energy at the interface of the insulating and semiconductor layers as shown in FIG. 3. Accordingly, the first band bending of the semiconductor layer, $\Psi_{SAM}$, is determined by the applied first voltage, $V_G$, which resulted in the measured capacitance approaching a constant value. Likewise, for a semiconductor layer 12 having a p-type dopant, the applied first bias voltage which results in the measured capacitance approaching a constant value determines the first band bending, $\Psi_{SAM}$, of the semiconductor layer 12 since the valence band, $E_V$, equals the Fermi energy level, $E_{FS}$, of the p-doped semiconductor layer 12 at the interface of the insulating and semiconductor layers.

The true band bending of the semiconductor layer 12 in accumulation mode is also calculated as follows:

$$\psi_{SA} = \frac{E_g}{2q} - \phi_B \qquad (1)$$

wherein $E_g$ is the band gap between the valence and conduction bands of the semiconductor layer 12 and q is the charge of an electron, namely, $1.60 \times 10^{-19}$ coulomb, and $\phi_B$ is calculated as:

$$\phi_B = \frac{kT}{q} \ln\left(\frac{N_B}{n_i}\right) \qquad (2)$$

wherein $n_i$ is the intrinsic carrier density at absolute temperature T and $N_B$ is the known doping density of a bulk region of the semiconductor layer 12.

The measured ($\Psi_{SAM}$) and the calculated true ($\Psi_{SA}$) band bending of the semiconductor layer 12 in accumulation are related as:

$$|\Psi_{SA}| = |\Psi_{SOA}| + |\Psi_{SAM}| \qquad (3)$$

The true offset or additive constant, $\Psi_{SOA}$, is dependent on both the initial charge on an MIS device prior to the application of any bias voltage as well as the work function difference of the MIS device. As equation (3) indicates, the calculated true band bending, $\Psi_{SA}$, of a semiconductor layer 12 in accumulation includes the true additive constant, $\Psi_{SOA}$, while the measured band bending, $\Psi_{SAM}$ of the semiconductor layer 12 does not. Accordingly, the true additive constant, $\Psi_{SOA}$, is calculated as the difference therebetween as shown in block 44 of FIG. 3.

Figure 2:
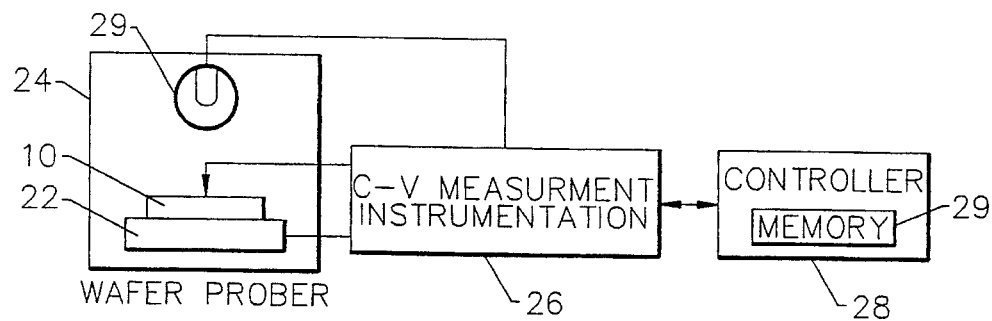
FIG. 2 is a block diagram of an apparatus designed to measure the doping density profile of a semiconductor layer according to the present invention.
Figure 3:
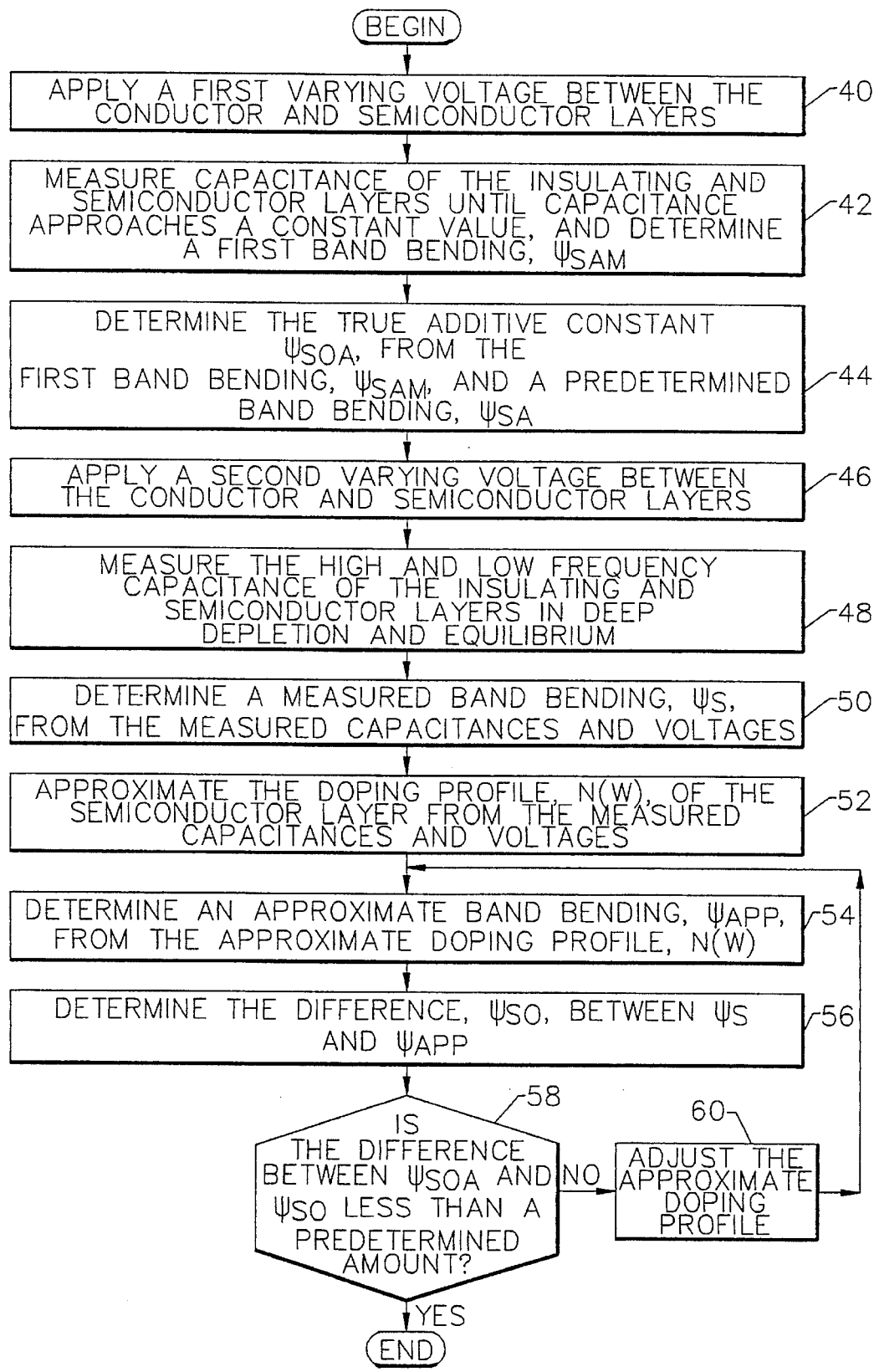
FIG. 3 is a flow chart illustrating operations for measuring the doping density profile of the semiconductor layer according to the present invention.

The bias voltage is applied and the resulting capacitance measured by the measuring apparatus illustrated in FIG. 2. In particular, the MIS device 10 is mounted on a pedestal 22 in a wafer prober 24. Electrical contact is then established to the gate electrode 18 and the semiconductor substrate electrode 20 such that a bias voltage may be applied therebetween and the resulting capacitance measured by the C-V measurement instrumentation 26.

In particular, the C-V measurement instrumentation 26 may include a number of instruments manufactured by Kiethley, and designated Package 82. The Kiethley Package 82 includes a programmable voltage source for applying the necessary bias voltage, typically in the form of a voltage staircase, to the MIS device under test. One exemplary programmable voltage source is Kiethley Model No. 230 which may apply a DC voltage with an AC signal superimposed thereon. The Kiethley Model No. 230 is used to apply voltages in excess of ±20 V. Voltages less than ±20 V are applied by the Model No. 590 high frequency C-V meter.

In addition, Kiethley Package 82 also includes both a quasistatic C-V meter and a high frequency C-V meter. The quasistatic C-V meter is typically a coulombmeter which determines the low frequency capacitance of the MIS device under test based upon the ratio of the change in charge of the MIS device due to the change in the applied DC bias voltage as explained hereinbelow. In contrast, the high frequency C-V meter measures the high frequency capacitance resulting from an applied bias voltage having a relatively high frequency AC signal superimposed thereon. For example, the quasistatic C-V meter may be a Kiethley Model No. 595 and the high frequency C-V meter may be a Kiethley Model No. 590.

As illustrated in FIG. 2, a controller such as a personal or general purpose computer, is preferably connected to the C-V measurement instrumentation 26 to control the operation of the C-V measurement instrumentation 26. In particular, a program is preferably stored in the memory means 29 of the controller 28 to control the operation of the C-V measurement instrumentation 26. For example, the controller 28 supplies signals to the C-V measurement instrumentation 26 which indicate the bias voltages to be applied and the measurements to be obtained. The C-V measurement instrumentation 26 also includes a remote input coupler, such as Kiethley Model No. 5951, to interconnect the wafer prober, the controller 28 and the C-V measurement instrumentation 26.

Once the band bending of the conduction and valence bands of the semiconductor layer 12 in accumulation mode have been measured and calculated, a second varying bias voltage is applied between the conductor and semiconductor layers as illustrated in block 46 of FIG. 3. The second bias voltage is also preferably applied between the gate and semiconductor substrate electrodes 18 and 20. The second bias voltage preferably includes a varying DC voltage having a high frequency AC signal superimposed thereon.

In particular, the DC component of the second bias voltage is preferably incrementally varied through a predetermined range of DC voltages. More specifically, the DC component of the second voltage is preferably varied between a first DC voltage wherein the semiconductor layer 12 is in accumulation and a second DC voltage wherein the semiconductor layer 12 is in depletion and, most preferably, in deep depletion. For example, for an n-doped semiconductor layer 12, a DC voltage is applied which ranges from 15 V to −15 V and is varied at 1.4 V/sec. An AC voltage having a maximum amplitude of 15 mV is superimposed upon the DC signal.

Figure 4:
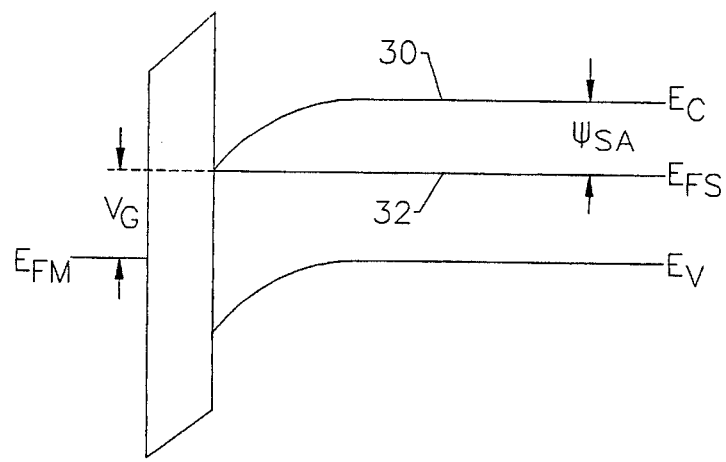
FIG. 4 is an energy band diagram of an exemplary MIS device having an n-type substrate in which the semiconductor layer is in an accumulation mode.

Once the semiconductor layer 12 is in depletion, the semiconductor layer 12 is preferably inverted. Various methods of inverting the semiconductor layer 12 may be employed. For example, the semiconductor layer 12 may be momentarily illuminated, such as by lamp means 29 as illustrated in FIG. 4. The illumination of the depleted semiconductor layer 12 inverts the semiconductor layer 12. Alternatively, the semiconductor layer 12 may be inverted by heating the semiconductor layer 12. Thereafter, the DC component of the second bias voltage is preferably varied from the second DC voltage wherein the semiconductor layer 12 is inverted to the first DC voltage wherein the semiconductor layer 12 is in accumulation.

As before, the resulting capacitance of the insulating and semiconductor layers is measured with respect to the voltage applied such that a high frequency C-V measurement of the MIS device may be obtained as shown in block 48 of FIG. 3. The high frequency capacitance is measured with the MIS device in both deep depletion and in equilibrium following inversion of the semiconductor layer 12.

Simultaneous with the high frequency C-V measurement, a low frequency C-V measurement of the MIS device in depletion and equilibrium is also obtained based upon the application of the second bias voltage. In particular, the second bias voltage is typically applied as a voltage staircase as described above. Accordingly the change in charge, $\Delta Q$, of the insulating and semiconductor layers may be measured by a coulombmeter, such as Kiethley Model No. 595, for each voltage step, $\Delta V$. The low-frequency capacitance, $C_{LF}$, may then be calculated as:

$$C_{LF} = \frac{\Delta Q}{\Delta V} \quad (4)$$

The effective frequency, $f_e$, of the second bias voltage is determined by the rate of change of the DC voltage staircase and is calculated as:

$$f_e = (2\pi t_D)^{-1} \quad (5)$$

wherein $t_D$ is the duration of each voltage step of the staircase. Preferably, the rate of change of the DC voltage is relatively slow. For example, the typical duration of the voltage step is 70 ms or longer such that the effective frequency is 2 Hz or less.

Alternatively, a low frequency C-V measurement of a MIS device may be obtained by applying a linearly varying second bias voltage to the MIS device. The displacement current resulting from the linearly varying bias voltage may be measured and the low frequency capacitance, $C_{LF}$, determined therefrom since the low frequency capacitance is proportional to the resulting displacement current. One method of simultaneously measuring the high and low frequency capacitance of the insulating and semiconductor layers of an MIS device with varying gate bias voltages applied thereto is described in detail by E. H. Nicollian and J. R. Brews in "MOS (Metal Oxide Semiconductor) Physics and Technology" John Wiley & Sons, Sec. 12.5.4(b) (1982).

Figure 5:
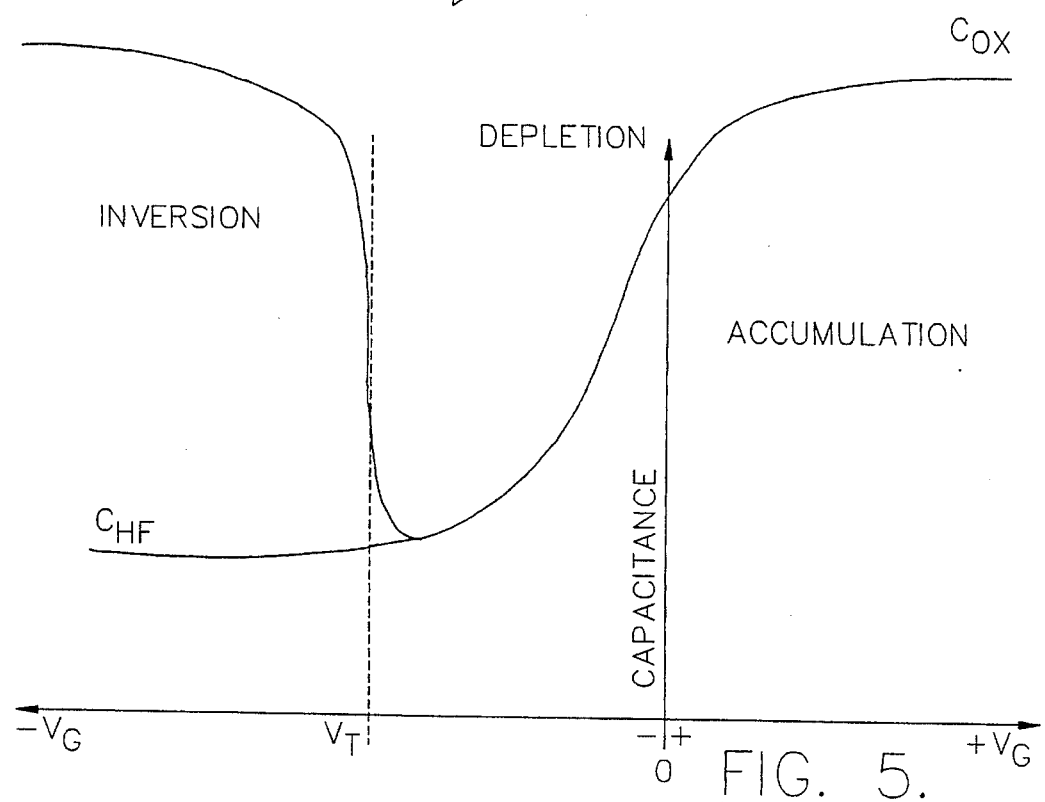
FIG. 5 is a graphical representation of exemplary equilibrium C-V measurements of an exemplary MIS device having an n-type substrate in which a DC bias voltage, $V_G$, has been applied with high and low frequency AC signals superimposed thereon.

Typical C-V relationships for an MIS device having an n-doped semiconductor layer 12 are illustrated in FIG. 5. In particular, FIG. 5 illustrates both the high frequency and low frequency equilibrium C-V measurements which are designated $C_{LF}$ and $C_{HF}$, respectively.

Once the C-V measurements have been obtained for an MIS device, the doping density profile of the semiconductor layer 12 of the MIS device 10 may be approximated based upon the measured capacitances and the corresponding bias voltages. More specifically, several calculations are performed based on the C-V measurements to determine the doping density profile.

Initially, the band bending of the conduction and valence bands of the semiconductor layer 12, $\Psi_S$, is determined as follows:

$$\Psi_S = V_G + \frac{Q_{MOS}(V_G)}{C_{OX}} \quad (6)$$

wherein $V_G$ is the applied second bias voltage and $C_{OX}$ is the capacitance of the insulating layer 14 which may be calculated as:

$$C_{ox} = \frac{\epsilon_0 \epsilon_r A}{d} \quad (7)$$

wherein $\epsilon_o$ is the permittivity of free space, namely, $8.85 \times 10^{-12}\ F/_M$; $\epsilon_r$ is the dielectric permittivity of the material forming the insulating layer 14, such as, for example, $\epsilon_r$ equals 3.8 for an insulating layer 14 comprised of $SiO_2$; A is the area of the insulating layer 14 between the conductor and semiconductor layers and d is the thickness of the insulating layer 14. In addition, the charge of the MIS device is dependent upon the applied bias voltage, $V_G$, and is calculated as:

$$Q_{MOS}(V_G) = \int_O^{V_G} C_{LF}(V)dV \quad (8)$$

Accordingly, based upon equations (6), (7) and (8), the relationship of the band bending of the conduction and valence bands of the semiconductor layer 12, $\Psi_S$, to the applied bias voltage, $V_G$, in deep depletion, may be determined.

Figure 6:
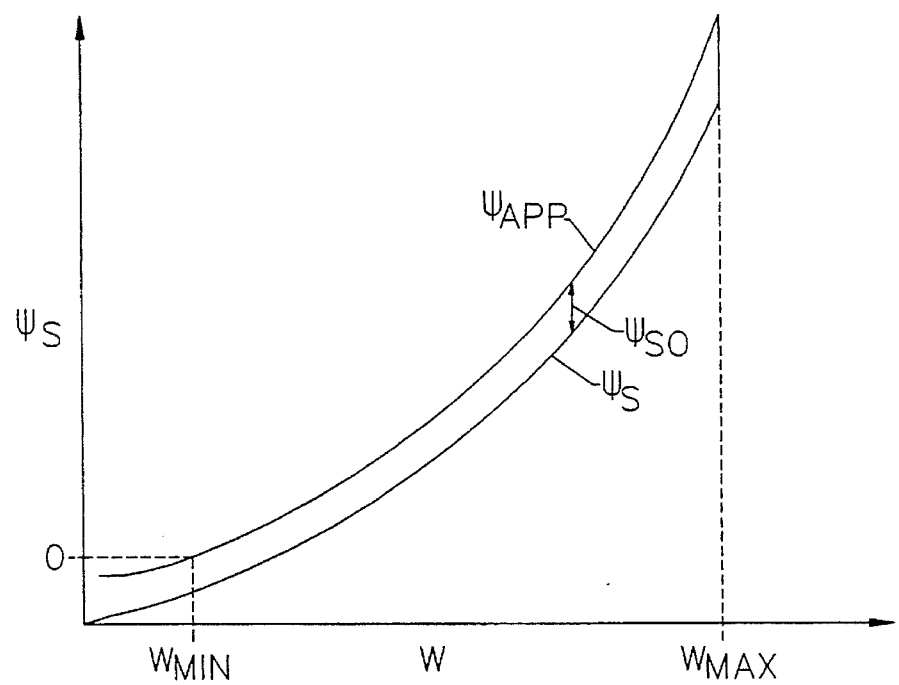
FIG. 6 is a graphical representation of the difference between second band bending of the semiconductor layer, $\Psi_s$, as measured and approximated.

Thereafter, the width of the depletion region of the semiconductor layer 12, w, within the semiconductor layer 12 from the interface of the insulating and semiconductor layers may be determined as a function of the applied second bias voltage as follows:

$$w(V_G) = \epsilon_0 \epsilon_S \frac{[C_{OX} - C_{HF}(V_G)]}{C_{OX} C_{HF}(V_G)} \quad (9)$$

wherein $\epsilon_S$ is the dielectric constant of the semiconductor layer 12, namely, 11.8 for a Si semiconductor layer. In particular, the width of the depletion region, w, within the semiconductor layer 12 can be determined based upon the measured valves of $C_{HF}$. Accordingly, the relationship of the band bending of the conduction and valance bands of the semiconductor layer 12, $\Psi_S$, to the depth of the depletion region, w, may be determined from equations (6)–(9), particularly for a semiconductor layer 12 in deep depletion, as illustrated in FIG. 6 and as shown in block 50 of FIG. 3.

Based upon the measured capacitances and corresponding second bias voltages applied between the conductor and semiconductor layers by the wafer prober 24, the doping density profile of the semiconductor layer 12 may be approximated as indicated in block 52 of FIG. 3. In particular, the doping density, N(w), at a depth of w in the semiconductor layer 12 from the interface of the insulating and semiconductor layers and 12 is defined as:

$$N(w) = \frac{-2}{q \, \epsilon_0 \epsilon_S \left( \frac{d}{d\psi_S} \right) \left( \frac{1}{C_D^2} \right)} = \quad (10)$$

$$\frac{1}{q \left( \frac{dw}{d\psi_S} \right) \left( \frac{1}{C_D} \right)} = \frac{C_D}{q} \left( \frac{d\psi_S}{dw} \right)$$

Thus, based upon the previously determined relationship of the band bending, $\Psi_S$, of the conduction and valence bands of the semiconductor layer 12 to the depth, w, of the depletion region within the semiconductor layer 12 from the interface of the insulating and semiconductor layers as illustrated in FIG. 6, the relationship between the doping density, N(w), and the depth, w, within the semiconductor layer 12 may be determined.

Figure 7:
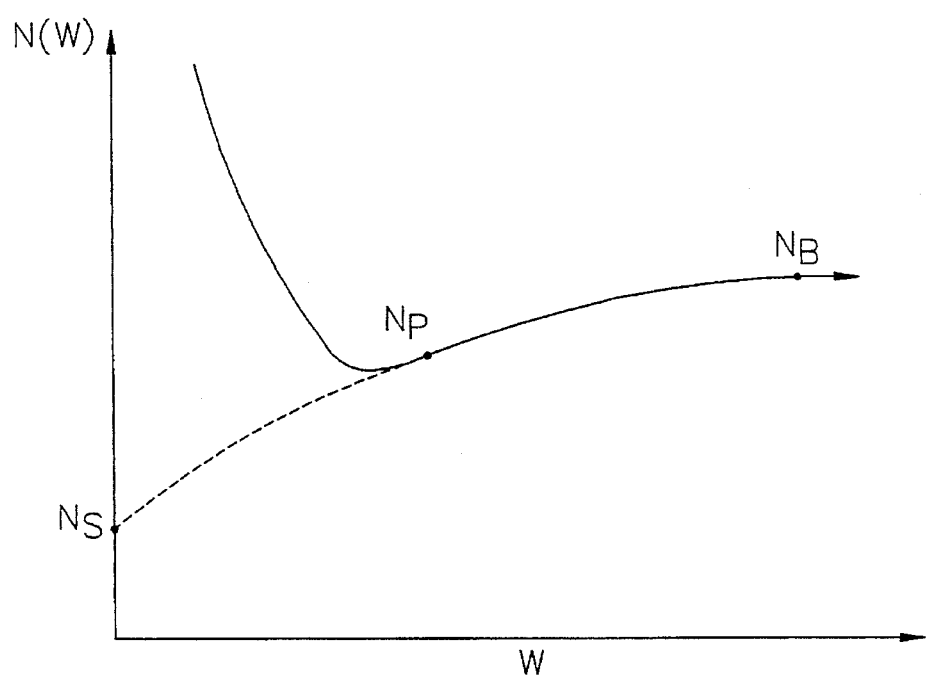
FIG. 7 is a graphical representation of an error function complement doping density profile of the semiconductor layer illustrating the measured and extrapolated portions thereof.

A graphical representation of a doping density profile, N(w), of a semiconductor layer 12 with respect to depth, w, within the semiconductor layer 12 is illustrated in FIG. 7. For purposes of illustration, a curve having the general shape of an error function compliment curve is depicted. As explained, a semiconductor layer in which the dopant is redistributed by thermal oxidation has a doping density profile having the general shape of an error function compliment curve. However, it will be known to those skilled in the art that the general shape of the doping density profile may also be a Gaussian curve or a constant doping level if the dopant is introduced by other methods.

It will be further noted from FIG. 7 that the relationship between the doping density, N(w), and the depth, w, within the semiconductor layer 12 increases rapidly in the region near the interface of the insulating and semiconductor layers. This rapid change is due to the inapplicability of the charge neutrality principle near the interface of the insulating and semiconductor layers. Accordingly, the doping density near this interface cannot be reliably calculated from the measured capacitances and the corresponding bias voltages.

In order to approximate the doping density in the region near the interface of the insulating and semiconductor layers, the curve illustrating the relationship between doping density, N(w), and depth, w, within the semiconductor layer 12 is extrapolated in the region near the interface from the measured doping density values in the bulk region of the semiconductor layer 12 as shown with a dashed line in FIG. 7.

The extrapolation is preferably performed by determining a least squares fit curve based upon the doping density calculated at various depths within the bulk region of the semiconductor layer 12. Based upon the general type of doping density profile, i.e. error function compliment (as illustrated in FIG. 7), Gaussian or constant, the least squares fit curve is extrapolated to the interfere of the insulating and semiconductor layers, as illustrated by $N_S$ in FIG. 7.

Based upon the approximate doping density profile resulting from the extrapolation of the least squares fit curve, an approximate band bending, $\Psi_{APP}$, of the conductance and valence bands of the semiconductor layers may be calculated therefrom as shown in block 54 of FIG. 3. In particular, the band bending of the semiconductor layer 12 as a function of the depth, w, within the semiconductor layer 12 is approximated from the extrapolated doping density as follows:

$$\Psi_{APP}(w) = \frac{q N_B w^2}{2 \epsilon_S \epsilon_0} + \frac{q}{\epsilon_S \epsilon_0} \int_0^W x [N(x) - N_B] dx \quad (11)$$

wherein, N(x), is derived from the extrapolated doping density profile of FIG. 7. The approximate band bending, $\Psi_{APP}(w)$, of the semiconductor layer 12 based upon the approximate doping density profile is dependent upon the depth within the semiconductor layer 12 as illustrated in FIG. 6.

The doping density profile, N(w), is based, in part, upon the derivative of the measured band bending, $\Psi_S$, with respect to the depth, w, within the semiconductor layer 12 from the interface. Since the doping density profile is based upon a derivative of the band bending, the true additive constant, $\Psi_{SO}$, which is included in the measured band bending, $\Psi_S$, is not included in the calculation of the doping density profile. Thus, the approximate band bending, derived from the extrapolated doping density profile also does not include the true additive constant, $\Psi_{SO}$. Therefore, the difference between the approximate band bending curve, $\Psi_{APP}$, and the band bending curve, $\Psi_S$, based upon measured capacitances and voltages is equal to the true additive constant, $\Psi_{SO}$, and may be calculated as:

$$\Psi_{APP}(W) - \Psi_S(W) = \Psi_{SO}(W) \quad (12)$$

While a single measure of the difference between the measured and approximate band bending curves of FIG. 6 could be made near the midpoint of the two band bending curves, the differences between the curves at several depths within the semiconductor layer 12 are preferably determined and averaged. More preferably, the difference between the two band bending curves illustrated in FIG. 6 is determined for all depths within the semiconductor layer 12 in which the semiconductor layer is in depletion or, more preferably, deep depletion. These differences may then be averaged to determine the additive constant therebetween.

In particular, the doping profile dependent additive constant for all depths within the semiconductor layer 12 in which the semiconductor layer 12 is in deep depletion may be determined as follows:

$$\psi_{SO} = (W_{max} - W_{min})^{-1} \int_{W_{min}}^{W_{max}} \{\psi_{APP}[N(x)] - \psi_S(x)\} dx \quad (13)$$

wherein $W_{max}$ is the largest depletion layer width measured in deep depletion and $W_{min}$ is the depth corresponding, to the first positive value of $\Psi_S$ for a p-doped semiconductor layer 12, or the first negative value of $\Psi_S$ for an a n-doped semiconductor layer. In addition, $\Psi_{APP}[N(x)]$ is based upon the approximate band bending curve while $\Psi_S(x)$ is based upon the band bending curve derived from the measured capacitances and voltages.

To determine if the approximate band bending curve, $\Psi_{APP}$, and, thus, the approximate or extrapolated doping density profile, N(w), is reliable, the doping profile dependent additive constant, $\Psi_{SO}$, determined by the difference between the approximate and measured band bending curves of FIG. 6 is compared with the true additive constant, $\Psi_{SOA}$, determined based upon the difference between the measured band bending, $\Psi_{SAM}$, and the calculated true band bending, $\Psi_{SA}$, of a semiconductor layer 12 in accumulation as shown in block 56 of FIG. 3.

If the difference between the additive constants is greater than a predetermined value, the approximation of the doping density profile of FIG. 7 is revised and the approximate band bending curve, $\Psi_{APP}$, is regenerated based upon the revised doping density profile as shown in blocks 58 and 60 of FIG. 3. Thereafter, the difference between the revised approximate band bending curve, $\Psi_{APP}$, and the measured band bending curve, $\Psi_S$, is again compared to the difference between the measured and calculated band bendings of the semiconductor layer 12 in accumulation. This revision process continues until the doping profile dependent additive constant, $\Psi_{SO}$, between the approximate and measured band bending curves of FIG. 6 is equal to or differs from the true additive constant, $\Psi_{SOA}$, determined from the difference between the measured and calculated band bendings of the semiconductor layer 12 in accumulation by less than a predetermined amount or percentage, such as less than a 0.1% difference therebetween.

The revision of the doping density profile is typically performed by selecting slightly different values of the parameters that determine N(x) in the bulk region of the semiconductor layer 12 through which the least squares fit curve is drawn. By revising the doping density profile, N(x), and approximate band bending curve, the true doping density profile, N(w), of the semiconductor layer 12 may be reliably determined and reliably extrapolated.

While the oxide thickness may be calculated based upon the dimensions of the MIS device and the materials forming the MIS device, the remainder of the process-dependent parameters may be readily computed as known to those skilled in the art based upon the reliable doping density profile measured according to the present invention. For example, the calculation of the process-dependent parameters based upon a doping density profile is illustrated in Nicollian and Brews, "MOS (Metal Oxide Semiconductor) Physics and Technology", John Wiley & Sons (1982) and Brews and Nicollian, Improved MOS Capacitor Measurements Using The Q-C Method, Solid-State Electronics, Vol. 27, p. 963 (1984). These process-related parameters include the fixed charge density in the insulating or oxide layer 14, the interface trap density, the voltage across the semiconductor layer 12 when operating in depletion mode with a bias voltage applied between the gate and semiconductor substrate electrodes and the threshold voltage, $V_T$, of the MIS device.

In the drawings and the specification, there has been set forth a preferred embodiment of the invention and, although specific terms are employed, the terms are used in a generic and descriptive sense only and not for purpose of limitation, the scope of the invention being set forth in the following claims.

That which is claimed is:

1. A method of measuring a doping density profile of a doped semiconductor layer, having an insulating layer thereon, and a conductor layer on the insulating layer opposite the semiconductor layer, the doping density profile measuring method comprising the steps of:

applying a first varying voltage between the conductor and semiconductor layers, and measuring a first resulting capacitance of the insulating and semiconductor layers until the first measured capacitance approaches a constant value;

determining a first band bending of the semiconductor layer based upon the first applied voltage and the first measured capacitance as the first measured capacitance approaches the constant value;

applying a second varying voltage between the conductor and semiconductor layers, and measuring a second resulting capacitance of the insulating and semiconductor layers;

approximating the doping density profile of the semiconductor layer based upon the second measured capacitance and the corresponding second voltage, and determining an approximate band bending of the semiconductor layer based upon the approximate doping density profile;

determining a difference between the approximate band bending of the semiconductor layer and a second measured band bending of the semiconductor layer based upon the second measured capacitance and the corresponding second varying voltage;

comparing the band bending difference determined thereby with the difference between the first band bending and a predetermined band bending of the semiconductor layer in an accumulation mode, to determine a variance therebetween; and adjusting the approximated doping density profile until the determined variance is less than a predetermined amount, such that the adjusted approximated doping density profile provides the doping density profile of the doped semiconductor layer.

2. The method of measuring a doping density profile according to claim 1 wherein the step of applying a first voltage comprises the step of varying the first voltage until the rate of change of the first measured capacitance of the insulating and semiconductor layers is less than a predetermined value.

3. The method of measuring a doping density profile according to claim 1 wherein the step of applying a second varying voltage comprises the step of applying a varying DC voltage having an AC signal superimposed thereon.

4. The method of measuring a doping density profile according to claim 3 wherein the step of applying a varying DC voltage having an AC signal superimposed thereon comprises the steps of:

varying the applied DC voltage through a predetermined range of DC voltages; and superimposing an AC signal to the applied DC voltage as the DC voltage is varied throughout the predetermined range.

5. The method of measuring a doping density profile according to claim 4 wherein the step of varying the applied DC voltage comprises the step of varying the applied DC voltage between a first DC voltage wherein the semiconductor layer is in an accumulation mode and a second DC voltage wherein the semiconductor layer is in a depletion mode.

6. The method of measuring a doping density profile according to claim 5 wherein the step of varying the applied DC voltage further comprises the steps of:

varying the applied DC voltage from a first DC voltage wherein the semiconductor layer is in an accumulation mode to a second DC voltage wherein the semiconductor layer is in a depletion mode;

momentarily illuminating the depleted semiconductor layer such that the semiconductor layer is in an inversion mode; and varying the applied DC voltage from the second DC voltage wherein the illuminated semiconductor layer is in an inversion mode to the first DC voltage wherein the semiconductor layer is in an accumulation mode.

7. The method of measuring a doping profile according to claim 1 wherein the step of approximating the doping density profile of the semiconductor layer comprises the steps of:

determining the doping density of a bulk region of the semiconductor layer based upon the first measured capacitance and corresponding second voltages; and extrapolating, base upon the second measured capacitance and corresponding second voltages, the determined doping density of the bulk region of the semiconductor layer and a predetermined type of doping density profile, to determine the doping density profile of a region of the semiconductor layer near the interface of the semiconductor and insulating layers.

8. The method of measuring a doping density profile according to claim 7 wherein the step of extrapolating comprises the steps of:

performing a least squares fit of the doping density determined at a plurality of depths within the semiconductor layer from the interface of the insulating and semiconductor layers; and determining the doping density at the interface of the insulating and semiconductor layers based upon the least squares fit of the doping density.

9. The method of measuring a doping density profile according to claim 6 wherein the adjusting step comprises the step of repeatedly revising the extrapolated doping density until the determined variance is less than a predetermined amount.

10. The method of measuring a doping density profile according to claim 1 further comprising the step of determining the second measured band bending based upon the second measured capacitance and the corresponding second voltages.

11. A method of measuring a doping density profile of a doped semiconductor layer having an insulating layer on the semiconductor layer, and a conductor layer on the insulating layer opposite the semiconductor layer, the doping density profile measuring method comprising the steps of:

applying a first voltage between the conductor and semiconductor layers such that the semiconductor layer is in a accumulation mode, and determining the resulting accumulation mode band bending of the semiconductor layer;

applying a second varying voltage between the conductor and semiconductor layers, and measuring a second resulting capacitance of the insulating and semiconductor layers;

approximating the doping density profile of the semiconductor layer based upon the second measured capacitance and corresponding second voltages, and determining an approximate band bending of the semiconductor layer based upon the approximate doping density;

comparing the difference between the approximate band bending of the semiconductor layer and a measured band bending of the semiconductor layer based upon the second measured capacitance and the corresponding second voltages and the difference between the accumulation mode band bending and a predetermined band bending of the semiconductor layer in accumulation mode, to determine the variance therebetween; and adjusting the approximated doping density profile until the determined variance is less than a predetermined amount such that the adjusted approximated doping density profile provides the doping density profile of the doped semiconductor.

12. The method of measuring a doping density profile according to claim 11 further comprising the step of measuring a first capacitance of the insulating and semiconductor layers resulting from the first varying voltage.

13. The method of measuring a doping density profile according to claim 10 wherein the step of applying a first voltage comprises the step of varying the first voltage and measuring the first resulting capacitance until the first measured capacitance approaches a constant value.

14. The method of measuring a doping density profile according to claim 13 wherein the step of applying a first voltage comprises the step of varying the first voltage until the rate of change of the first measured capacitance of the insulating and semiconductor layers is less than a predetermined value.

15. The method of measuring a doping density profile according to claim 11 wherein the step of applying a second varying voltage comprises the step of applying a varying DC voltage having an AC signal superimposed thereon.

16. The method of measuring a doping density profile according to claim 15 wherein the step of applying a varying DC voltage having an AC signal superimposed thereon further comprises the steps of:

varying the applied DC voltage through a predetermined range of DC voltages; and superimposing an AC signal to the applied DC voltage as the DC voltage is varied throughout the predetermined range.

17. The method of measuring a doping density profile according to claim 16 wherein the step of varying the applied DC voltage comprises the step of varying the applied DC voltage between a first DC voltage wherein the semiconductor layer is in an accumulation mode and a second DC voltage wherein the semiconductor layer is in a depletion mode.

18. The method of measuring a doping density profile according to claim 17 wherein the step of varying the applied DC voltage further comprises the steps of:

varying the applied DC voltage from a first DC voltage wherein the semiconductor layer is in an accumulation mode to a second DC voltage wherein the semiconductor layer is in a depletion mode;

momentarily illuminating the depleted semiconductor layer such that the semiconductor layer is in an inversion mode; and varying the applied DC voltage from the second DC voltage wherein the illuminated semiconductor layer is in an inversion mode to the first DC voltage wherein the semiconductor layer is in an accumulation mode.

19. The method of measuring a doping density profile according to claim 11 wherein the step of approximately the doping density profile of the semiconductor layer comprises the steps of:

determining the doping density of a bulk region of the semiconductor layer based upon the second measured capacitance and corresponding second voltages; and extrapolating, based upon the second measured capacitance and corresponding second voltages, the determined doping density of the bulk region of the semiconductor layer and a predetermined type of doing density profile, to determine the doping density profile of a region of the semiconductor layer near the interface of the semiconductor and insulating layers.

20. The method of measuring a doping density profile according to claim 19 wherein the step of extrapolating comprises the steps of:

performing a least squares fit of the doping density determined at a plurality of depths within the semiconductor layer from the interface of the insulating and semiconductor layers; and determining the doping density at the interface of the insulating and semiconductor layers based upon the least squares fit of the doping density.

21. The method of measuring a doping density profile according to claim 11 wherein the adjusting step comprises the step of repeatedly revising the extrapolated doping density until the determined variance is less than a predetermined amount.

22. A method of measuring a doping density profile of a doped semiconductor layer having an insulating layer on the semiconductor layer, and a conductor layer on the insulating layer opposite the semiconductor layer, the doping density profile measuring method comprising the steps of:
   determining a band bending additive constant of the semiconductor layer;
   measuring the resulting capacitance of the insulating and semiconductor layers as a varying voltage is applied between the conductor and semiconductor layers;
   determining an approximate band bending of the semiconductor layer based upon an approximate doping density profile determined from the measured capacitance and corresponding varying voltage;
   comparing the difference between the approximate band bending of the semiconductor layer and a measured band bending of the semiconductor layer based upon the measured capacitance and the corresponding varying voltage to the band bending additive constant, to determine a variance therebetween; and
   adjusting the approximated doping density profile until the determined variance is less than a predetermined amount.

23. The method of measuring a doping density profile according to claim 22 wherein the step of determining the band bending additive constant comprises the steps of:
   applying a first varying voltage between the conductor and semiconductor layers, and measuring the first resulting capacitance of the insulating and semiconductor layers until the first measured capacitance approaches a constant value;
   determining a first band bending of the semiconductor layer based upon the first applied voltage and the first measured capacitance as the first measured capacitance approaches the constant value; and
   determining the difference between the first band bending and a predetermined band bending of the semiconductor layer in accumulation mode.

24. The method of measuring a doping density profile according to claim 23 wherein the step of applying a first voltage comprises the step of varying the first voltage until the rate of change of the first measured capacitance of the insulating and semiconductor layers is less than a predetermined value.

25. The method of measuring a doping density profile according to claim 23 wherein the step of applying a first voltage comprises the step of applying a first voltage between the conductor and semiconductor layers such that the semiconductor layer is in an accumulation mode, and wherein the step of determining a first band bending of the semiconductor layer comprises the step of determining the resulting band bending of the semiconductor layer in accumulation.

26. An apparatus for measuring a doping density profile of a doped semiconductor layer, having an insulating layer thereon, and a conductor layer on the insulating layer opposite the semiconductor layer, the doping density profile measuring apparatus comprising:
   means for applying a first varying voltage between the conductor and semiconductor layers, and for measuring a first resulting capacitance of the insulating and semiconductor layers until the first measured capacitance approaches a constant value;
   means, responsive to said first varying voltage applying means, for determining a first band bending of the semiconductor layer based upon the first measured capacitance and corresponding applied first voltage as the capacitance approaches a constant value, and for determining a first band bending difference between the first band bending and a predetermined band bending;
   means for applying a second varying voltage between the conductor and semiconductor layers, and for measuring a second resulting capacitance of the insulating and semiconductor layers throughout a predetermined range of second voltages;
   means, responsive to said second varying voltage applying means, for approximating the doping density profile of the semiconductor layer based upon the second measured capacitance and the corresponding second voltages, and for determining an approximate band bending of the semiconductor layer based upon the approximate doping density profile;
   means, responsive to said doping density profile approximating means and said approximate band bending determining means, for determining a second band bending difference between the approximate band bending of the semiconductor layer and a second band bending of the semiconductor layer determined from the second measured capacitance and the corresponding second voltages; and
   adjusting means, responsive to said first and second band bending difference determining means, for revising the approximated doping density profile until the difference between the first and second band bending differences is less than a predetermined amount such that the revised approximated doping density profile provides the doping density profile of the doped semiconductor layer.

27. The doping density profile measuring apparatus according to claim 26 further comprising comparing means for determining the difference between the first and second band bending differences.

28. The doping density profile measuring apparatus according to claim 26 wherein said second varying voltage applying means includes means for illuminating the semiconductor layer once the semiconductor layer is in a depletion mode so as to invert the semiconductor layer.

29. The doping density profile measuring apparatus accordingly to claim 26 wherein said first varying voltage applying means, said first band bending determining means, said second varying voltage applying means, said doping density profile approximating means, said second band bending difference determining means and said adjusting means comprise C-V measurement instrumentation.

30. The doping density profile measuring apparatus according to claim 29 further comprising a controller operably connected to said C-V measurement instrumentation for controlling the operation of said C-V measurement instrumentation.

31. The doping density profile measuring apparatus according to claim 30 wherein said controller includes a general purpose computer having memory means for storing a computer program for controlling the operation of said C-V measurement instrumentation.

32. An apparatus for measuring a doping density profile of a doped semiconductor layer having an insulating layer on the semiconductor layer, and a conductor layer on the insulating layer opposite the semiconductor layer, the doping density profile measuring apparatus comprising:

means for determining a band bending additive constant of the semiconductor layer;

means for measuring the resulting capacitance of the insulating and semiconductor layers as varying voltages are applied between the conductor and semiconductor layers;

means, responsive to said measuring means, for determining an approximate band bending of the semiconductor layer based upon an approximate doping density determined from the measured capacitance and the corresponding varying voltages;

means, responsive to said band bending additive constant determining means and the approximate band bending determining means, for comparing the difference between the approximate band bending of the semiconductor layer and a measured band bending of the semiconductor layer, based upon the measured capacitance and the corresponding varying voltages, to the band bending additive constant, to determine a variance therebetween; and adjusting means, responsive to said comparing means, for revising the approximated doping density profile until the determined variance is less than a predetermined amount such that the revised approximated doping density profile provides doping density profile that dopes semiconductor layer.

33. A doping density profile measuring apparatus according to claim 32 wherein said means for determining the band bending additive constant comprises:

means for applying a first varying voltage between the conductor and semiconductor layers;

means, responsive to said first varying voltage applying means, for measuring a first resulting capacitance of the insulating and semiconductor layers until the first measured capacitance approaches a constant value; and means, responsive to said measuring means, for determining a first band bending of the semiconductor layer based upon the first varying voltage and the first measured capacitance as the first measured capacitance approaches the constant value; and means, responsive to said first band bending determining means, for the determining the difference between the first band bending and a predetermined band bending of the semiconductor layer in an accumulation mode.

34. A doping density profile measuring apparatus according to claim 33 wherein said first varying voltage applying means comprises means for varying the first voltage until the rate of change of the first measured capacitance of the insulating and semiconductor layers is less than a predetermined value.

35. A doping density profile measuring apparatus according to claim 34 wherein said first varying voltage applying means comprises means for applying a first voltage between the conductor and semiconductor layers such that the semiconductor layer is in an accumulation mode, and wherein said first band bending determining means comprises means for determining the resulting band bending of the semiconductor layer in accumulation.

* * * * *